United States Patent
Armbruster et al.

(10) Patent No.: US 11,874,514 B2
(45) Date of Patent: *Jan. 16, 2024

(54) OPTICAL SYSTEM WITH SAFETY COMPONENT

(71) Applicant: HIGHYAG LASERTECHNOLOGIE GMBH, Kleinmachnow (DE)

(72) Inventors: Eduard Armbruster, Berlin (DE); Frank Schulze, Berlin (DE)

(73) Assignee: II-VI DELAWARE, INC., Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 17/656,298

(22) Filed: Mar. 24, 2022

(65) Prior Publication Data

US 2022/0214510 A1  Jul. 7, 2022

Related U.S. Application Data

(63) Continuation of application No. 16/274,897, filed on Feb. 13, 2019, now Pat. No. 11,314,027.

(30) Foreign Application Priority Data

Feb. 15, 2018 (LU) .......................... 100706
Oct. 22, 2018 (LU) .......................... 100973

(51) Int. Cl.
*H04B 10/032* (2013.01)
*G02B 6/44* (2006.01)
(Continued)

(52) U.S. Cl.
CPC ......... *G02B 6/4296* (2013.01); *G01R 31/083* (2013.01); *G02B 6/28* (2013.01);
(Continued)

(58) Field of Classification Search
CPC ... G02B 6/4469; G02B 4/4296; H04B 10/032
See application file for complete search history.

(56) References Cited

U.S. PATENT DOCUMENTS 4,134,642 A  1/1979  Kapron et al.
4,174,149 A  11/1979  Rupp
(Continued)

FOREIGN PATENT DOCUMENTS

CN    1090853 C    9/2002
DE    19806629 A1  10/1998
(Continued)

OTHER PUBLICATIONS

Final Office Action in U.S. Appl. No. 16/272,179 dated Oct. 15, 2021, 15-pgs.
(Continued)

*Primary Examiner* — Eric Wong
(74) *Attorney, Agent, or Firm* — Blank Rome LLP (57) ABSTRACT

A light guide or beam guiding system with safety component and a method for its breakage monitoring. The present invention provides a fiber optic cable comprising a power fiber as well as first and second channels for break and plug monitoring of the power fiber, wherein the first and second channels may be separate.

20 Claims, 5 Drawing Sheets

(51) Int. Cl.
*G02B 6/42* (2006.01)
*G01R 31/08* (2020.01)
*G02B 6/293* (2006.01)
*H04B 10/25* (2013.01)
*G02B 6/28* (2006.01)
*G02B 6/38* (2006.01)
*G08C 23/06* (2006.01)
*G02B 6/12* (2006.01)

(52) U.S. Cl.
CPC ........... *G02B 6/29391* (2013.01); *G02B 6/38* (2013.01); *G02B 6/4292* (2013.01); *G02B 6/4415* (2013.01); *G08C 23/06* (2013.01); *H04B 10/032* (2013.01); *H04B 10/25891* (2020.05); *G02B 2006/12147* (2013.01); *G02B 2006/4297* (2013.01)

(56) References Cited

U.S. PATENT DOCUMENTS

| | | | |
|---|---|---|---|
| 4,297,794 A | 11/1981 | Luthi | |
| 4,595,839 A * | 6/1986 | Braun | G02B 6/4292 250/227.24 |
| 4,778,248 A | 10/1988 | Arzur et al. | |
| 4,883,054 A | 11/1989 | Fuller et al. | |
| 5,532,864 A | 7/1996 | Alexander et al. | |
| 5,535,139 A | 7/1996 | Barringer et al. | |
| 5,793,481 A | 8/1998 | Leali | |
| 6,259,517 B1 | 7/2001 | Tedesco et al. | |
| 6,559,437 B1 | 5/2003 | Pope et al. | |
| 8,526,810 B2 * | 9/2013 | Cole | H04B 10/0775 398/10 |
| 9,784,642 B2 | 10/2017 | Strong et al. | |
| 2007/0248358 A1 * | 10/2007 | Sauer | G02B 6/4416 398/115 |
| 2008/0310848 A1 * | 12/2008 | Yasuda | G02B 6/4416 398/115 |
| 2011/0013905 A1 | 1/2011 | Wang et al. | |
| 2012/0176243 A1 | 7/2012 | Andersen | |
| 2014/0138151 A1 | 5/2014 | Islam | |
| 2020/0220616 A1 * | 7/2020 | Huybrechts | H04B 10/07955 |

FOREIGN PATENT DOCUMENTS

| | | | | |
|---|---|---|---|---|
| DE | 202005005869 U1 | 8/2005 | | |
| DE | 102004010275 B3 | 9/2005 | | |
| DE | 202005018553 U1 | 1/2006 | | |
| DE | 102008025095 A1 * | 12/2009 | ........... | G02B 6/4466 |
| EP | 0006364 A1 | 1/1980 | | |
| EP | 1378778 A1 | 1/2004 | | |
| EP | 1662288 A1 | 5/2006 | | |
| EP | 2035801 A1 | 3/2009 | | |

OTHER PUBLICATIONS

Office Action in Chinese Appl. 201910116291.3, dated Jul. 5, 2021, 7-pgs.

\* cited by examiner

OPTICAL SYSTEM WITH SAFETY COMPONENT

CROSS REFERENCE TO RELATED APPLICATIONS

The present application is a continuation of U.S. application Ser. No. 16/274,897 filed Feb. 13, 2019, which claims priority to Luxembourg Patent Application No. LU 100973 filed on Oct. 22, 2018 and to Luxembourg Patent Application No. LU 100706 filed on Feb. 15, 2018. The aforementioned applications are hereby incorporated by reference in their entireties.

BACKGROUND OF THE INVENTION

Field of the Invention

The invention relates to a fiber optic cable or beam guiding system with safety component as well as to a method for monitoring its breakage.

Brief Description of the Related Art

For high-performance fiber optic cables, a protection against uncontrolled leaking laser radiation is prescribed for reasons of safety at work. Therefore, it is recommended to use a safety system to monitor the breakage of fiber optic cables, as damage (such as fiber breakage) releases dangerous amounts of laser light that can cause irreversible damage to the human body. Therefore, even in the event of damage to fiber optic cables, a security system should be triggered and shut down the laser.

Solutions for fiber optic cables breakage monitoring are known from the prior art. For example, published German patent application DE 19806629 A1 discloses a method for monitoring the bending radius and for breakage monitoring of optical cables and further a light guide cable for application of said method. The monitoring is performed by introducing at least one additional optical fiber to the main optical fiber into the optical cable, which is equipped with a receiving system. The variation of radiation transmitted through the monitoring fiber is used to detect excessive bending or breakage. When a dangerous condition is detected, a warning signal is generated, or the power transmission is switched off.

Published German utility model DE 20 2005 005 869 U1 discloses a supply line, in particular a tube package for an industrial robot, with a number of cables and/or lines as well as with an integrated monitoring sensor for monitoring the deformation of the supply line, which comprises a cladding-free optical fiber, which is surrounded by a sheath so that it is pressed by force against the optical fiber, wherein the optical fiber is connected to a feed point for coupling-in light and with an evaluation device.

Published European patent application EP 1 662 288 A1 (corresponding to published German utility model DE 20 2005 018 553 U1) discloses a protective device for an optical fiber, comprising a protective tube, at least one electrical conductor loop guided through the protective tube with a defined electrical impedance and a special electrical impedance insulation of the conductor loop, wherein the protective tube has a two- or multi-layered construction, consisting of an inner layer of an optically transparent, electrically insulating material and at least one overlying layer of a non-transparent material, and further a conductor loop is routed through the tube in addition to the optical fiber, consisting of two mutually insulated electrical conductors which are connected at one end of the tube via a defined electrical impedance and at the other end to an impedance-controlling measuring unit, and wherein the insulation of the two electrical conductors is chosen such that it results from the thermal effect of leaking light in the event of breakage of the optical fiber or by the radiation, either to influence the electrical conductors or to direct contact of the electrical conductors or at least one of the electrical conductors is severed, and finally a change of the resistance is detectable by the measuring unit.

Published U.S. Pat. No. 4,298,794 discloses a so-called hot spot detector for a power cable or the like and includes an optical fiber having a plurality of cores enclosing an input core into which light energy is coupled. The core diameters, spacings and materials of the cores and cladding are carefully selected so that crosstalk from the input core to the secondary cores occurs only near the point along the fiber where the hot spot is located. Light energy then propagates along the secondary nuclei and modal interference causes a beating phenomenon that creates spatial interference that can be analyzed as an energy flow between the secondary nuclei. By measuring the light intensity patterns exiting the secondary cores at at least two different wavelengths, the location of the hot spot along the fiber can be calculated. The teaching of this document utilizes the effect that the coupling between the different nuclei is dependent on both temperature and wavelengths. A disadvantage of this measurement method, however, is that it is limited to low laser powers, precisely because the application is a sensor. The arrangement and use of multiple cores make the fiber too complex and therefore expensive. This applies in particular when the main core of the fiber is used to transport high powers in the range of several kW of laser light.

Published European Patent Application EP 0 006 364 A1 discloses an optical cable comprising at least one separate optical fiber and/or optical bundle. The optical fiber or bundle is loosely housed in the cable or surrounded by an elongated compartment delimited by a fluid impermeable sheath or fluid impermeable sheath. The elongate compartment extends the entire length of the cable and contains a fluid, e.g. air above or below atmospheric pressure, at such pressure, the detection of a pressure change of the fluid is adapted to indicate damage to the fluid-impermeable wall. The cable may also include at least one electrical conductor extending radially outward from the optical fiber or bundle along the cable length, with a detectable current flowing in the conductor which is part of an electrical alarm system. In the case of a high-performance fiber optic cable, a sheath or conduit has a different function: it serves as a kind of fire barrier, which after a fiber breakage must last until the laser is shut off. For a multi-kW laser, this process typically takes about 30 ms or longer. If the signal for switching off the laser comes only after the protective tube has already been destroyed, some kW of laser power is delivered to the surroundings of the optical cable during this time. Thus, the arrangement and method disclosed in this document are inherently too slow to guarantee the prevention of personal injury.

Published German patent application DE 10 2004 010 275 B3 discloses a device for monitoring a laser light cable which comprises an optical waveguide, an inner metal cladding surrounding the optical waveguide, an insulating cladding surrounding the inner metal cladding and an outer cladding surrounding the insulating cladding Has metal sheath. Furthermore, the device has a first electrical circuit for monitoring a circuit comprising the inner metal sheath, a second electrical circuit for monitoring the resistance between the inner and outer metal sheaths and, according to the invention, a third electrical circuit for monitoring the capacitance between the inner and outer metal sheaths. Fracture monitoring is accomplished by measurements of both resistance and capacitance between the inner and outer metal sheaths of the protective tube, which are normally not interconnected and thus do not form a closed loop. The disclosed device thus serves to monitor a violation of the protective tube and not to directly detect the breakage of a light-conducting fiber which carries light of high power. A disadvantage of this method is thus also the long reaction time, which can sometimes lead under certain circumstances that high-genetic light may emerge.

Published European Patent Application EP 2 035 801 A1 discloses an arrangement comprising an optical fiber and a detection device, the optical fiber comprising a core region and a cladding region surrounding the core region, the core region having a higher refractive index than the cladding region, so that the detection device may detect a damaged optical fiber. The detection method detects a fiber breakage by means of an electrical line running in or on the cladding region. This can then be used either as a stand-alone run for pulses or by means of a second wire as a closed electrical circuit. A disadvantage of this embodiment is that a metallic, electrical conductor must be arranged in or on the jacket of the optical conductor. Metal and glass have mutually different thermal expansion coefficients, which means that this combination can withstand only small temperature differences, without causing damage. Designs that want to avoid these disadvantages are complex and therefore expensive Thus, the breakage in fiber optic cables is currently monitored based on the detection of electrical parameters by monitoring elements integrated into the light guiding cable, such as two or three electrical conductors, which are separated from each other by an insulation which changes their property upon irradiation with laser light.

With such monitoring measures neither clear redundancy nor diversity can be ensured, which leads to the fact that in addition to the security mechanisms used in the optical fiber cables further, external mechanisms are required to build a total person-secure system. This represents an additional expense for the plant builder and the certification body.

SUMMARY OF THE INVENTION

An object of the present invention is therefore to provide a redundant and possibly diverse break monitoring, which represents a safety component of the beam-guiding system.

The present invention provides an optical fiber optic cable comprising an optical power fiber and a separate safety channel disposed within the fiber optic cable comprising at least two separate channels for monitoring breakage of the power fiber.

In an aspect of the present invention, a first and a second channel of the at least two separate channels of the separate safety channel transmit mutually different signals selected from electrical and/or optical signals.

The optical fiber cable may further comprise at least a first electrical channel and a second electrical or optical channel.

It is further envisaged that the optical fiber cable may comprise a plug at least one end of the optical fiber cable for connection to further optical elements and wherein the security channel is also arranged in this plug of the optical fiber cable.

In a further aspect, the security channel may also be arranged in a socket for the plug of the optical fiber cable.

It is further intended that as the first channel, an electrical line is arranged in the optical fiber cable for driving a source of the second channel and as a second channel an electrical line or a control optical fiber is arranged in the optical fiber cable.

In a further embodiment, a first and a second channel of the at least two separate channels of the separate safety channel connect the source arranged at one end of the optical fiber cable for generating an electrical signal, an electromagnetic wave or an optical signal with a detector arranged on the other end of the optical fiber cable.

The absorption of at least one of the components of an optical channel may be within the wavelength range of the power transported in the power fiber.

The optical fiber cable may further comprise plug-in connections at at least one end of the light-emitting cable for transmitting user data.

It is further envisaged that the source can be arranged in a socket connected to the optical fiber cable, in the plug, in the optical fiber cable itself or in a device connected to the light guiding element.

Another object of the present invention encompasses an optical light guidance system comprising at least two interconnected optical fiber cables as described above or interconnected optical light guiding components.

Another object of the present invention relates to a method of fracture monitoring optical fiber cables, comprising the steps of
  Monitoring the transmission of a first signal by means of a first device of a safety channel located within the cladding of the optical fiber cable along the optical power fiber;
  Monitoring the transmission of the second optical or electrical signal through a second device of the safety channel, which is disposed within the sheathing of the optical fiber cable, along the optical power fiber.

The method may further encompass the step of at least a first electrical channel and a second electrical or optical channel being used as the safety channel.

It is further intended that the signal to be transmitted can be generated outside the optical fiber cable or in a connector connected to the optical fiber cable.

In a further aspect at least one of the devices may also be used for data transmission.

The method may further be used in a light guiding system comprising at least two interconnected optical fibers as described above or interconnected light guiding components.

The method may further encompass that the transmission of at least one signal is interrupted unless the connector is fully inserted.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE FIGURES

The invention will be described based on figures. It will be understood that the embodiments and aspects of the invention described in the figures are only examples and do not limit the protective scope of the claims in any way. The invention is defined by the claims and their equivalents. It will be understood that features of one aspect or embodiment of the invention can be combined with a feature of a different aspect or aspects of other embodiments of the invention, in which:

DETAILED DESCRIPTION OF THE INVENTION

The above-stated object of the invention is solved by the features of the nondependent claims. The dependent claims cover further specific embodiments of the invention.

The object of the invention is solved in that a break monitoring for a fiber optic cable or a beam guiding system consisting of several sub-systems (or fiber optic cables) is provided, which is multi-channel. The term "multi-channel" in the sense of the present invention means that the monitoring takes place on at least two channels, such as an electrical and an optical channel.

A channel within the meaning of the present invention designates a part of the entire safety channel. A safety channel consists thus of at least two channels. The entire safety channel is integrated into the parts of the beam delivery system (e.g., fiber optic cable, light pipe connectors, etc.). The present invention provides a safety channel which ensures the safety of an operating system even in the event of a non-detected failure of a channel. The redundant design of the parts of the safety channel thus increases the reliability of the detection of a fiber break before the laser sight can leave the protective tube. The at least two channels as part of a safety channel according to the invention may be different or the same in their function and operation. Each channel is inside the protective tube, ie in the immediate vicinity of the power fiber. However, they are separate parts, not components of the power fiber.

A channel as part of the safety channel may be an electrical channel which runs along the beam guiding system and is independently capable of performing at least one of the functions enumerated below:

a. Fracture monitoring: The electrical conductors are designed so that they are able to detect the breakage of the power fiber and thus take over a sensory part of the channel.

b. Plug-in monitoring: The transfer point (for example optical cable plug for optical cable connection) of the electrical conductors is designed in such a way that all involved conductors are safely disconnected if the optical cable plug is not inserted correctly in the optical cable socket.

c. Detectability: Enable the detection of failures of the safety functions a. and b.

d. Logic function: Sequential connection (ORDERING) of the features a., B. and c.

e. Interface to an evaluation unit [for the realization of a complete safety channel].

The geometry of the electrical conductors is not limited, so possible designs are several separate conductors, a least two-core cable or the lines may be coaxial with each other An optical channel as part of a security channel according to the invention is a combination of at least one separate, so-called control or monitoring fiber is fed in addition to the power fiber in the protective tube and the required coupling elements arranged in the protective tube, plug, socket or in a separate device and required for the electrical transmission and processing converter. At least one control fiber material is selected to absorb the wavelength of the high-power laser radiation, i.e., at least one core, clad, protective coating, or outer cladding material. The control or monitoring fiber passes light for monitoring. The optical channel runs along the beam guidance system and is independently able to take on at least one of the following functions.

a. Fracture Monitoring: The monitoring fiber is designed to detect the breakage of the power fiber, thus assuming a sensory portion of the safety channel.

b. Plug-in monitoring: The transfer point of the monitoring fiber, such as the optical fiber cable connector, is designed to be safely disconnected if the optical fiber cable plug is not inserted correctly in the optical fiber cable socket.

c. Detectability: Enable the detection of failures of the safety functions a. and b. To ensure detectability, the light that is passed through the monitor fiber must have at least one property different from the light of high power laser radiation (e.g., wavelength, modulation, power . . . ).

d. Logic function: Sequential connection (ORDERING) of the features a., B. and c.

e. Interface to an evaluation unit for the realization of a complete safety channel The transmission within the light guidance system as well as the evaluation unit may include a conversion of the optical signals into electrical signals (and vice versa).

The connections to the source and the detector of the monitoring light are realized on a respective connector. In this case, the source and detector can be located in the plug, in the receptacle or further away.

In the latter case, the monitoring light is passed through another fiber to or from the plug. The detector is connected to the verification electronics. That may be the source as well, but alternatively the source can be powered on in a different way. Only light is fed into the monitor fiber when the source side plug is properly inserted into its receptacle. If the detector-side connector is not properly plugged into its receptacle, either no light will arrive at the detector (if the detector is housed in the receptacle or farther away) or the electrical connection to the verification electronics will be interrupted (if the detector is plugged in) sitting)

When two channels are optically implemented, it is also possible for the light to be coupled from one monitoring fiber to the other to a plug when this plug is properly inserted in its receptacle.

Since each channel is in itself capable of detecting a dangerous state (for example, a broken power fiber or an incorrectly inserted optical fiber cable connector), so should both of these channels (within a defined time window) occur when such a state occurs provide the same information to the evaluation unit. If the channels provide different information (because, for example, a channel is defective), the dangerous energy source is also switched off. In addition, it can be recognized from the presence of different information of both channels that one of the channels is no longer functional. With this information, for example, a reconnection of the dangerous energy source can be prevented.

With a safety channel according to the present invention, the damage to the power fiber is detected, even if the sheath or protective tube is still intact. This is a distinction to known from the prior art solutions. Furthermore, the safety channel according to the present invention is also independent of an applied in the protective hose overpressure or underpressure, since directly damage to the power fiber is detected. The optical channel of a safety channel according to the invention includes a separate fiber which is separate from the power fiber The invention described herein provides increased reliability of breakage monitoring of fiber optic cables through the use of redundancy through the use of two channels. In addition, in some embodiments, diversity of the monitoring channels is achieved through the use of different technologies A multi-channel system increases the probability of detection of errors and can meet the requirements for achieving personal safety through the redundancy, which should allow certification. By combining, for example, an electrical and an optical channel, a true diversity can be created. As a result, the security in the detection of optical cable damage is significantly increased advantageous In addition to a separate detection of the at least two channels and a detection of cross-circuit detection between the independent channels can be provided The terms light guiding elements and optical elements will be used synonymously in connection with the description of the present invention. Both can designate a fiber optic cable or a connector for fiber optic cable. Plug or connections for coupling-in and decoupling of laser radiation are also encompassed by these terms. An optical system is formed of light guiding elements or optical elements.

Figure 1:
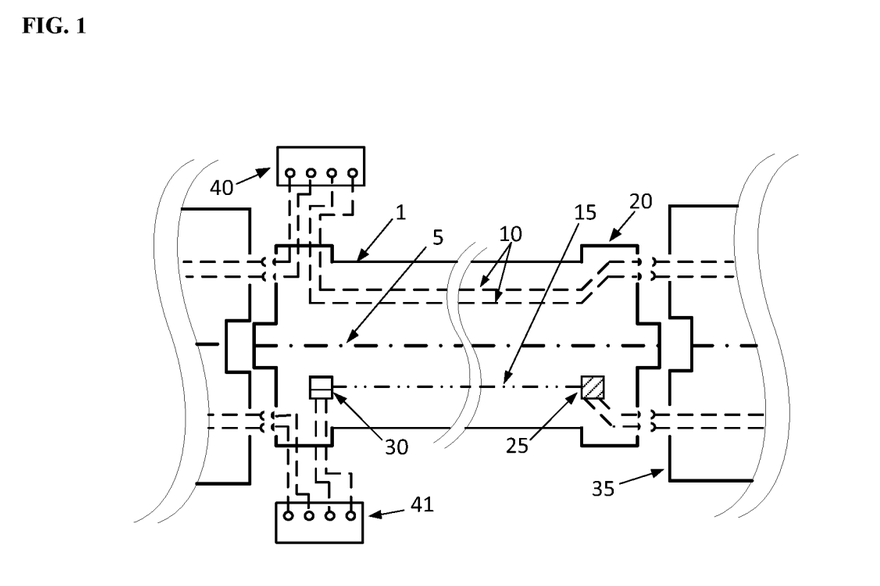
FIG. 1 shows a fiber optic cable with power fiber, as well as electrical channel and control fiber.

FIG. 1 shows an embodiment in which the optical fiber cable is sheathed with a protective tube 1 and, in addition to the power fiber 5, a further so-called control fiber 15 is laid within the same protective sheath and a source 25 and a detector 30 are inserted into the fiber optic cable connector 20 or fiber optic cable connector, respectively fiber optic cable socket 35 are added. The control fiber should be arranged in a manner that it will also be damaged if the power fiber is damaged to ensure reliable detection. The control fiber guides an electromagnetic wave, which is generated by a source/(a) transmitter, from one end of the optical fiber cable to the other. The other end of the control fiber is terminated with a detector/receiver, which detects whether the control fiber is intact when the wave emitted by the source is received correctly at the detector.

The coaxial cable 1 forms the first monitoring channel 10 and the control fiber 15 a second monitoring channel along power fiber 5. Both channels use different media (electrical and optical) for the signal line of the monitoring signals and thus create a true diversity and redundancy.

It must be ensured when implementing this concept, that a suitable control fiber 15 is used. In particular, the absorption of the control fiber 15 in the wavelength range of the power carried in the power fiber 5 and the crosstalk (optical coupling) of power fiber into the control fiber are to be considered.

Crosstalk from the power fiber 5 into the control fiber 15 may be separated from the signal of the power fiber 5 by a suitable signal patterns generated by source 25. A suitable signal pattern is any property of the light generated by source 25, which differs from characteristics of the light carried in the power fiber 5. This may be, for example, a particular wavelength, a combination of different wavelengths or the modulation of the signal generated by the source.

By appropriate spectral choice of the source and the detector as well as by sheathing the control fiber crosstalk can be minimized.

The access to both channels can be realized both by separately led out of the fiber connector plug (plug 1 40 and plug 2 41 in FIG. 1) and directly by contacting the plug monitoring in the optical fiber cable socket. As shown in FIG. 1, the channels can be led out through separate connections or, depending on the embodiment, through a combined connection.

The plug-in monitoring is a device that monitors whether the end of the optical fiber cable or beam guiding system is properly inserted into the matching recording.

Figure 2:
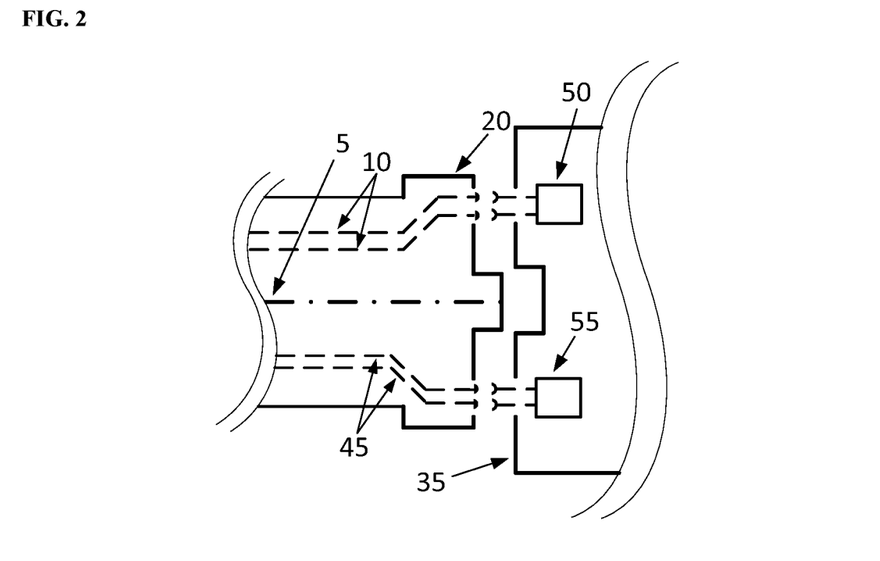
FIG. 2 shows an optical fiber cable with second coaxial cable as the second electrical channel.

FIG. 2 shows a further embodiment in which, in addition to the power fiber 5 and the already existing (coaxial) cable 1 10 for breakage monitoring, another (coaxial) cable 2 45 is added to the optical fiber cable instead of the control fiber 15 for breakage monitoring and thus forms the second channel of the monitoring system. The evaluation of both channels can be designed in different ways. One possibility is the parallel evaluation of both channels. For this purpose, proven evaluation principles can be used. The optical fiber cable plug 20 is connected to the optical fiber cable socket 35, in which impedance 1 50 is connected to the coaxial cable 1 10 and impedance 2 55 with the coaxial cable 2 45.

Figure 3:
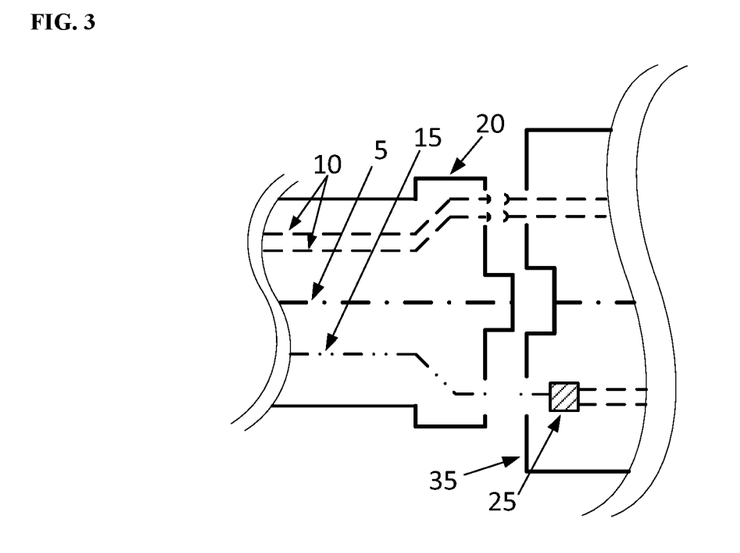
FIG. 3 shows a schematic representation of a redundant and diverse transfer point.

FIG. 3 shows the basic structure of a redundant and diversified transfer point between e.g. optical fiber cable plug 20 and optical fiber cable socket 35. Both monitoring channels go over at the transfer point to the next component of the light delivery system. The source/transmitter 25 was moved from the optical fiber cable plug 20 into the optical fiber cable socket 35. By transfer of the electrical channel, designed as a coaxial cable 1 10 and the optical channel (control fiber 15) offers the plug monitoring now the advantage of dual-channel and diversity. Possible disorders, such as shorting the electrical contact of the fiber connector (or inadvertently terminating with the terminating impedance) will not cause the safety function to fail.

In addition to the electrical connection, a defined optical coupling between the source/transmitter and the monitoring element in the optical fiber cable must be ensured.

Figure 4:
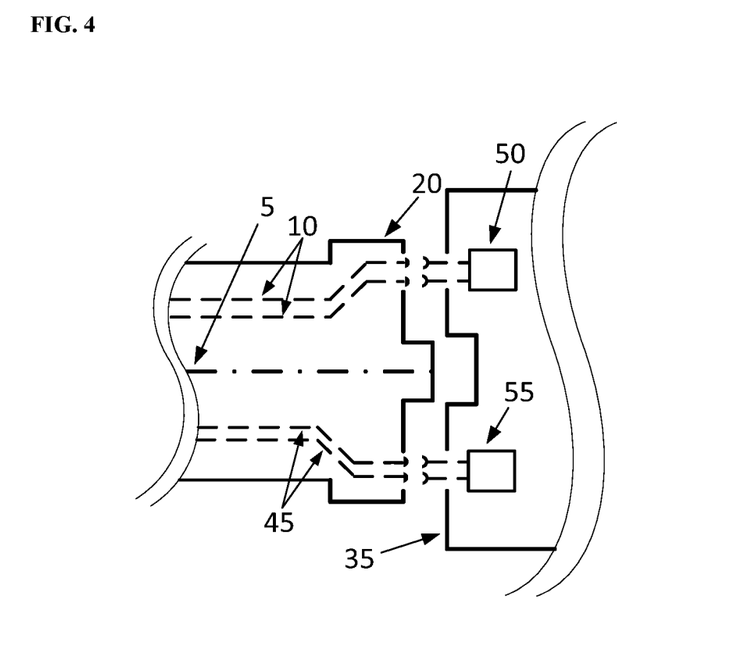
FIG. 4 shows a schematic representation of redundant plug-in monitoring at the transfer point.

FIG. 4 shows a redundant plug-in monitoring. The structure corresponds to the description in FIG. 2. Here, both channels are electrically designed. The interconnection of the plug-in monitoring shown in FIG. 4 represents a possible variant. The plug-in monitoring interrupts both channels of the fraction monitoring integrated in the optical fiber cable. This interruption can be detected by a suitable evaluation.

Figure 5:
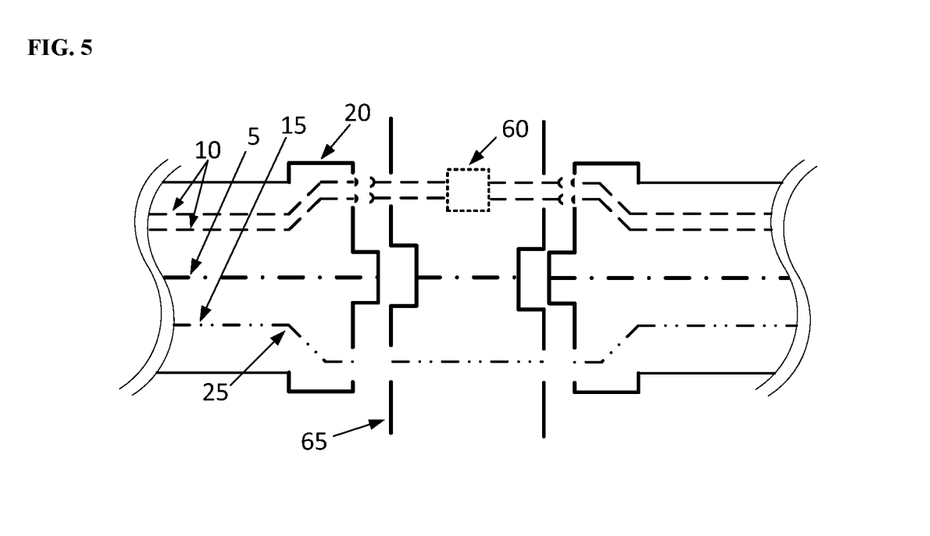
FIG. 5 shows a serial connection of light guiding components.

In FIG. 5, an optical fiber cable is shown with plug 20 having two monitoring circuits as described above. Both are transferred at the optical fiber cable socket to the next component 65 of the light guidance system (also sub-system). It is a coaxial cable 1 10 as a first channel and a control fiber 15 shown as a second channel. The embodiment shown in FIG. 5 relates to the connection of further sub-systems to the embodiments described above and thus the realization of duplexing of sub-system without weakening of the security requirements. As a result, the continuous, redundant monitoring runs across the connection of two subsystems.

The sum of the subsystems forms the beam guidance system, which is also referred to as a system.

A source 25 generates suitable electrical signals which are fed into a monitoring channel. The second monitoring element forms the second channel (or return channel). This can be designed both optically (see above) and electrically (see above). By returning the signal via the monitoring channel 2, it is possible to arrange the feed and the evaluation of the monitoring signals at the same end of the beam guidance system.

The light guidance system must be designed in a manner that there is either only a coupling between the two monitoring channels at the end of the monitoring chain, or both monitoring channels are evaluated separately.

In the case of several interconnected subsystems, it is advantageous to implement a control and condition monitoring of the components involved. This requires data transmission along the light guidance system. In the simplest case, this could be realized by a separate running wiring (prior art), which, however, is cumbersome to handle for the user.

The invention integrates a data transmission path into the light guidance components involved. This integration also allows the development of more feature-rich components. Thus, for example, the integration of additional sensors, data storage, actuators, etc. can be realized in the components of the light delivery system which can be controlled without additional effort of the user or can be read.

By using internally routed data transfer channels, intermodular communication along the light delivery system can be realized. This allows the transport and exchange of user data.

In a further embodiment of the invention, user data are distributed along the light guiding system (optical fiber cable, optical fiber cable coupler, etc.). The distribution of the data includes not only a purely passive data transport (which is additionally possible), but also a direct integration of the participating subsystems as active components (referred to as optional communication member 60 in FIG. 5) in the resulting network.

For example, if the fiber optic cable or other component of the beam or light guiding system itself is an active participant in the data transfer, it may itself also inject payload data (e.g., serial number, type, sensor data, etc.) into the data stream. The same applies to all other connected subsystems. These can be executed both passively (pure data transport) and actively (participation in the data exchange). User data refers to all types of data that have nothing to do with maintaining the security function. This can be any data of all connected subsystems and their peripherals. This includes control signals for the operation of the subsystems as well as sensor data.

User (or payload) data refers to all types of data that have nothing to do with the maintenance of the safety function. This can be any data of all connected subsystems and their peripherals. This includes control signals for the operation of the sub-systems as well as sensor data.

An advantageous possibility is to use the interfaces and connections for data transmission, which are integrated anyway for the optical fiber cable safety circuit. The additionally required elements for coupling and decoupling the data must not impair the safety function.

By an appropriate design, it is even possible to design the data stream so that by the data transport itself a part of the security monitoring can be taken over. This can be done, for example, by a combined data stream of security and user data, which supplements the currently customary monitoring of the optical fiber cable monitoring sensor properties. Thus, a separate data line is obsolete in many cases, thereby simplifying the handling of the entire system.

If passive (regarding participation in data transfer) components (like optic fiber cable) are to become active components so far, a power supply for the active parts has to be guaranteed. This can be done via separate connections or be implemented to a limited extent via the data lines themselves.

Figure 6:
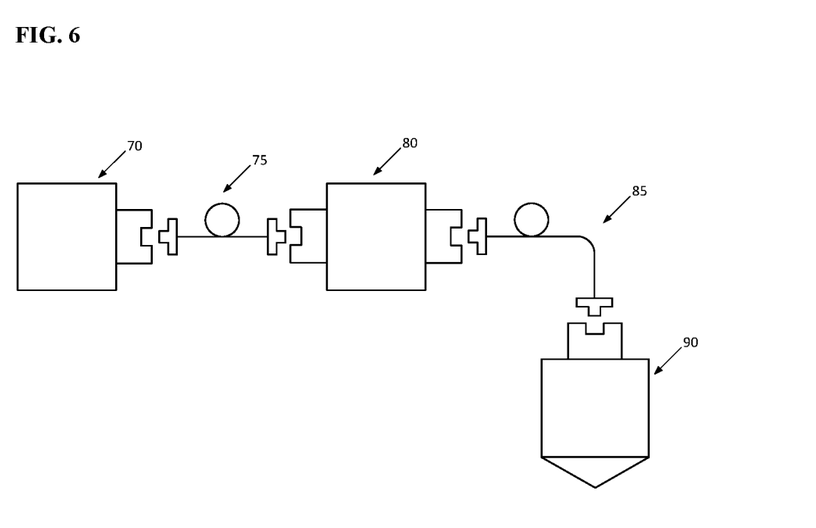
FIG. 6 shows a light guiding system, which is divided into subsystems.

FIG. 6 shows an exemplary light guiding system, which is subdivided into subsystems 70, 75, 80, 85, 90 and comprises of laser (subsystem 1, 70), optical fiber cable 1 (subsystem 2, 75), optical fiber coupler (sub-system 3, 80), optical fiber cable 2 (sub-system 4, 85) and a laser processing head (sub-system 5, 90).

Figure 7:
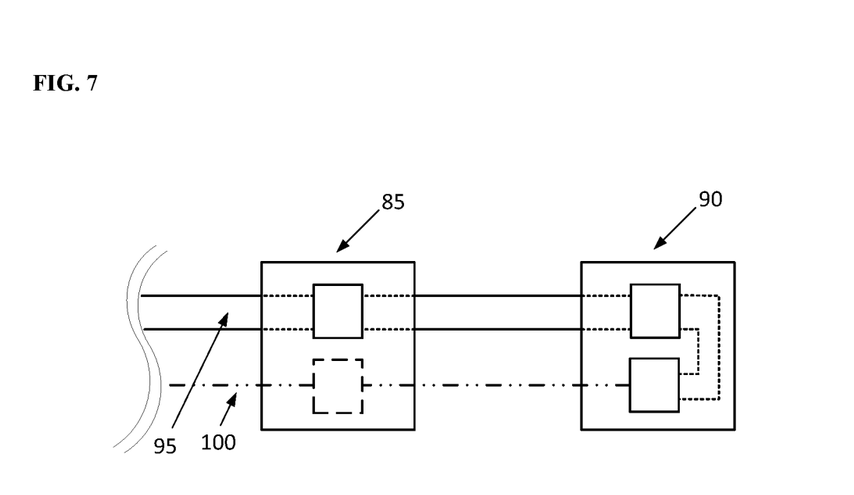
FIG. 7 shows a structure of a data transmission path in subsystems.

FIG. 7 shows a possible basic structure of the data transmission path on the basis of the subsystems 4, 85 and subsystem 5, 90. In this case, by way of example, a redundantly diverse security system comprising monitoring channel 1, 95 and monitoring channel 2, 100 is shown as data transmission paths. However, the operation is applicable regardless of the transmission medium Each active subsystem contains a communication module. This receives the incoming data stream, modifies this depending on the task of the subsystem and sends it on to the next subsystem. The last subsystem in the chain closes the connection between the two transmission channels and thus represents the conclusion of the chain.

Figure 8:
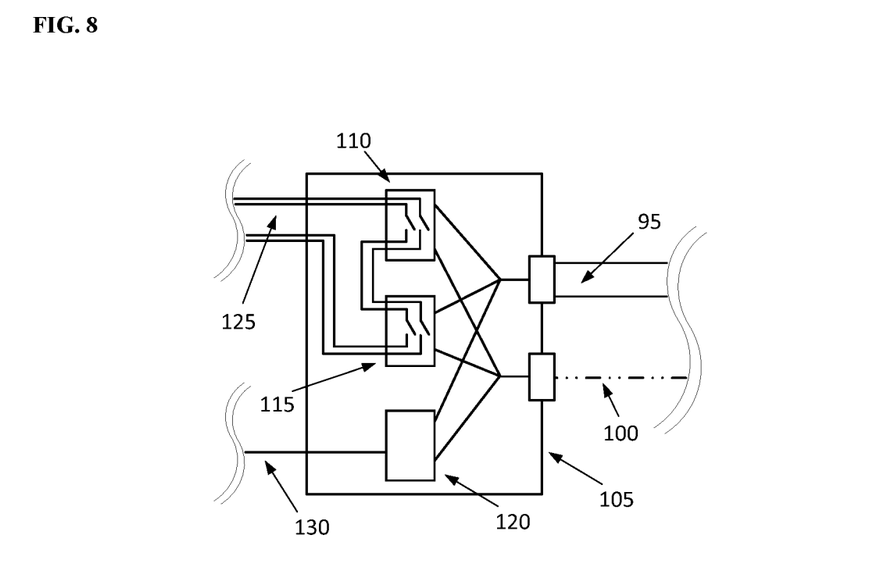
FIG. 8 shows a schematic structure of an evaluation unit.

FIG. 8 shows the schematic structure of the evaluation unit 105. This has two main tasks
  a. Monitor the parameters relevant to the safety function (safety ID A (SIDA), safety ID B (SIDB), cycle time, short in the transmission channel, interruption in the transmission channel, etc.) of the transmission path and output their status (safety circuit output),
  b. To provide an interface for coupling and decoupling the user data IDN (user data/communication).

The evaluation unit 105 forms the coupling element between the transmission channels 1, 95 and 2, 100 to the higher-level system. Evaluation SIDA 110, SIDB 115 and IDN 120 are carried out in evaluation unit 105. Evaluation unit 105 also has the output of safety circuit 125 and an output of the user data or data for communication 130.

Figure 9:
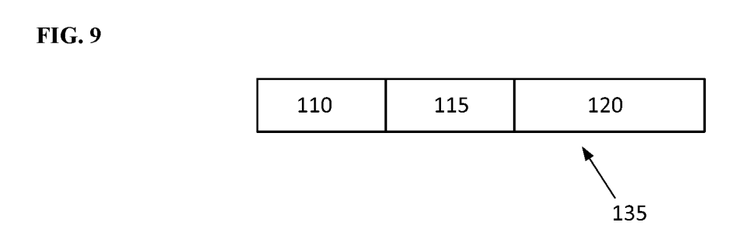
FIG. 9 shows the structure of a data package.

FIG. 9 shows a possible structure of the data packet 135 which is sent by the evaluation unit 105 (not shown), modified by the communication modules (not shown) of the subsystems and received again by the evaluation unit and evaluated. The data packet 135 includes the data of the evaluation SIDA 110, SIDB 115 and IDN 120. If the two channels are interconnected completely independently of each other with the evaluation unit (or the evaluation), it is of course also possible only the security IDs over the respective channel send, so SIDA on the one channel and SIDB on the other channel.

SIDA and SIDB represent unique single (per overall system) identification features of the redundant safety evaluations. Each safety evaluation sends and evaluates only the identification feature determined by it and for her.

SIDA and SIDB must be transmitted cyclically, the time for such a cycle depends on the required response time of the safety function and is also monitored by the components responsible for the safety of the evaluation.

The remaining time of a cycle, which is not required for the transmission of the SIDA and SIDB, is used for the transmission of the user data IDN The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

REFERENCE NUMERALS 1 protective tube
5 power fiber
10 coaxial cable 1
15 control fiber
20 optical fiber cable plug
25 source/transmitter
30 detector/receiver
35 optical fiber cable socket
40 plug 1
41 plug 2
42 coaxial cable 2
50 impedance 1
55 impedance 2
60 communication member
65 component of light guiding system
70 sub-system 1
75 sub-system 2
80 sub-system 3
85 sub-system 4
90 sub-system 5
95 monitoring/transmitting channel 1
100 monitoring/transmitting channel 2
105 evaluation unit
110 evaluation SIDA
115 evaluation SIDB
120 evaluation IDN
125 output safety circuit
130 user data/communication
135 data package

What is claimed is:

1. An apparatus to communicate laser power for a laser processing operation, the apparatus comprising:
a cable having first and second ends;
a power fiber disposed inside the cable and being configured to transport the laser power between the first and second ends of the cable;
an electrical line disposed inside the cable and being configured to conduct an electrical monitoring signal between the first and second ends of the cable;
an optical fiber disposed inside the cable and being configured to conduct an optical monitoring signal between the first and second ends of the cable; and
an evaluation unit disposed in electrical communication with the electrical line and disposed in optical communication with the optical fiber, the evaluation unit being configured to redundantly evaluate interruption in the transport of the laser power for the power fiber based on the electrical and optical monitoring signals.

2. The apparatus of claim 1, wherein the evaluation unit comprises a source disposed in communication with the optical fiber and the electrical line, the source being powered at least in part by the electrical monitoring signal of the electrical line and being configured to generate the optical monitoring signal for the optical fiber.

3. The apparatus of claim 2, wherein the source is arranged in a socket to which at least one of the first and second ends of the cable connects, in a cable plug disposed on at least one of the first and second ends of the cable, in the cable itself, or in a device connected to the cable.

4. The apparatus claim 1, wherein the evaluation unit comprises a detector disposed in communication with the optical fiber and being configured to detect the optical monitoring signal.

5. The apparatus claim 4, wherein the detector is arranged in a socket to which at least one of the first and second ends of the cable connects, in a cable plug disposed on at least one of the first and second ends of the cable, in the cable itself, or in a device connected to the cable.

6. The apparatus of claim 1, wherein the evaluation unit is configured to evaluate the interruption in response to a break in the power fiber along the cable.

7. The apparatus of claim 6, wherein an absorption of a material of the optical fiber is within a wavelength range of the laser power transported in the power fiber.

8. The apparatus of claim 1, wherein the electrical line comprises a coaxial cable.

9. The apparatus of claim 1, further comprising at least two laser sub-systems for the laser processing operation, each having an interface being configured to couple to one of the first and second ends of the cable, each interface being configured to connect in optical communication with the power fiber, in electrical communication with the electrical line, and in optical communication with the optical fiber.

10. The apparatus of claim 9, wherein the at least two laser sub-systems comprise one or more of: a laser source configured to generate the laser power; a coupler configured to couple the cable to another cable; and a laser processing head configured to emit the laser power for the laser processing operation.

11. The apparatus of claim 9, wherein the evaluation unit is configured to redundantly evaluate the interruption in response to a misconnection at the interface of either of the electrical monitoring signal and the optical monitoring signal.

12. The apparatus of claim 9, wherein at least one of the at least two laser sub-systems comprise an active data transfer participant being configured to inject a data signal in at least one of the electrical line and the optical fiber, the data signal having payload data usable by at least one of the at least two laser sub-systems, the data signal being used as at least one of the electrical monitoring signal and the optical monitoring signal for the redundant evaluation of the interruption.

13. The apparatus of claim 12, wherein the payload data in the data signal comprises one or more of: user data, a serial number, a type, sensor data, a control signal, non-safety function data, data associated with at least one of the at least two sub-systems, and data associated with a peripheral of the at least two sub-systems.

14. The apparatus of claim 9, wherein each of the first and second ends of the cable comprises a cable plug disposed on the respective end of the cable and being configured to connect to a socket of one of the at least two laser subsystems, the cable plug having transfer points for the power fiber, the electrical line, and the optical fiber configured to connect to the socket.

15. The apparatus of claim 1, wherein the evaluation unit is configured to monitor, for the electrical and optical monitoring signals, at least one of: a safety function, a cycle time, a short in transmission, and an interruption in transmission.

16. A method, comprising:
communicating laser power between laser sub-systems including a laser source and a laser processing head by transporting the laser power through a power fiber located within at least one cable;
performing redundant monitoring in the transport of the laser power by monitoring transmission of an electrical monitoring signal through an electrical line located within the at least one cable while redundantly monitoring transmission of an optical monitoring signal through an optical fiber located within the at least one cable; and
evaluating interruption in the transport of the laser power for the power fiber based on the transmissions in the redundant monitoring.

17. The method of claim 16, wherein performing the redundant monitoring comprises generating the optical monitoring signal for the optical fiber using a source powered at least in part with the electrical monitoring signal of the electrical line.

18. The method of claim 16, comprising stopping the transport of the laser power for the power fiber in response to a misconnection of either of the electrical and optical monitoring signals between the at least one cable and at least one of the laser sub-systems.

19. The method of claim 16, wherein evaluating the interruption in the transport of the laser power comprises evaluating the interruption in response to a break in the power fiber along the at least one cable.

20. The method of claim 16, further comprising injecting a data signal in at least one of the electrical line and the optical fiber, the data signal having payload data usable by at least one of the laser sub-systems, wherein performing the redundant monitoring comprises using the data signal as at least one of the electrical monitoring signal and the optical monitoring signal for evaluating the interruption.

* * * * *